(12) United States Patent
Simenas et al.

(10) Patent No.: US 12,270,874 B2
(45) Date of Patent: Apr. 8, 2025

(54) PROBEHEAD INSERT FOR EPR APPARATUS

(71) Applicant: UCL Business Ltd, London (GB)

(72) Inventors: Mantas Simenas, London (GB); James Campbell O'Sullivan, London (GB); Christoph Wilhelm Zollitsch, London (GB); Oscar William Kennedy, London (GB); John Julian Larrarte Morton, London (GB)

(73) Assignee: UCL BUSINESS LTD, London (GB)

( * ) Notice: Subject to any disclaimer, the term of this patent is extended or adjusted under 35 U.S.C. 154(b) by 127 days.

(21) Appl. No.: 18/041,625

(22) PCT Filed: Aug. 16, 2021

(86) PCT No.: PCT/GB2021/052116
§ 371 (c)(1),
(2) Date: Feb. 14, 2023

(87) PCT Pub. No.: WO2022/038340
PCT Pub. Date: Feb. 24, 2022

(65) Prior Publication Data
US 2023/0305087 A1    Sep. 28, 2023

(30) Foreign Application Priority Data
Aug. 17, 2020 (GB) .................................. 2012806

(51) Int. Cl.
*G01R 33/345* (2006.01)
*G01R 33/36* (2006.01)
*G01R 33/60* (2006.01)

(52) U.S. Cl.
CPC ....... *G01R 33/345* (2013.01); *G01R 33/3614* (2013.01); *G01R 33/60* (2013.01)

(58) Field of Classification Search
CPC .. G01R 33/345; G01R 33/3614; G01R 33/60; G01R 33/36; G01N 24/10
See application file for complete search history.

(56) References Cited

U.S. PATENT DOCUMENTS 5,389,878 A * 2/1995 Nakagawa ............. G01R 33/60
324/316

FOREIGN PATENT DOCUMENTS

GB         1067621 A       5/1967
JP      H04126184 U  *  11/1992

OTHER PUBLICATIONS

Machine translation of JPH04126184 U (Year: 1992).*

(Continued)

*Primary Examiner* — G. M. A Hyder
(74) *Attorney, Agent, or Firm* — William J. Clemens; Shumaker, Loop & Kendrick, LLP

(57) ABSTRACT

An insert for an EPR probehead is disclosed. The insert comprises a directional coupler and an amplifier. The directional coupler receives microwave power from a source at a first port and transfers a portion of the received microwave power to a second port for transmission to a sample space. The directional coupler is also arranged to receive a microwave signal from the sample space at the second port and to pass the majority of the received microwave signal to a third port. The amplifier has an input and an output; the input is arranged to receive the microwave signal from the third port of the directional coupler and to produce an amplified version of the received microwave signal at the output for transmission to a detector.

11 Claims, 4 Drawing Sheets

(56) References Cited

OTHER PUBLICATIONS

Seck M et al: "A sensitive broadband high-frequency electron spin resonance/electron nuclear double resonance spectrometer operating at 5-7.5 mm wavelength", Review of Scientific Instruments, AIP, Melville, NY, US, vol. 69, No. 4, Oct. 21, 1998 (Oct. 21, 1998), pp. 1817-1822, XP012036530, ISSN: 0034-6748, DOI: 10.1063/1.1148847 section B; figure 2.
Narkowicz R. et al: "A cryogenic receiver for EPR", Journal of Magnetic Resonance., vol. 237, Oct. 11, 2013 (Oct. 11, 2013), pp. 79-84, XP055854912, US ISSN: 1090-7807, DOI: 10.1016/j.jmr.2013.09.017 section 7; figure 1.
Eaton G R et al: "A signal-to-noise standard for pulsed EPR", Journal of Magnetic Resonance, Academic Press, Orlando, FL, US, vol. 205, No. 1, Apr. 24, 2010 (Apr. 24, 2010), pp. 109-113, XP027084285, ISSN: 1090-7807 [retrieved on Apr. 24, 2010] p. 111, paragraph 3.
Simenas Mantas et al: "A sensitivity leap for X-band EPR using a probehead with a cryogenic preamplifier", Journal of Magnetic Resonance, Academic Press, Orlando, FL, US, vol. 322, Nov. 17, 2020 (Nov. 17, 2020), XP086441443, ISSN: 1090-7807, DOI: 10.1016/J.JMR.2020.106876 [retrieved on Nov. 17, 2020] the whole document.
Seck, et al., "A sensitive broadband high-frequency electron spin resonance/electron nuclear double resonance spectrometer operating at 5-7.5 mm", 6 pages, Apr. 1998, Rev. Sci. Instrum., vol. 69.†
Narkowicz, et al., "A cryogenic receiver for EPR", 6 pages, Dec. 2013, Journal of Magnetic Resonance, vol. 237.†
Simenas, et al., "A sensitivity leap for X-band EPR using a probehead with a cryogenic preamplifier", 7 pages, Jan. 2021, Journal of Magnetic Resonance, vol. 322.†
Eaton, et al., "A Signal-to-Noise Standard for Pulsed EPR", 5 pages, Jul. 2010, Journal of Magnetic Resonance, vol. 205, Issue 1.†

\* cited by examiner
† cited by third party

18 DIRECTIONAL COUPLER
24, 44 TERMINATION LOAD
40 POWER LIMITER
46 TEMPERATURE SENSOR

PROBEHEAD INSERT FOR EPR APPARATUS

FIELD OF THE INVENTION

The present invention relates to an insert for a probehead for an electron paramagnetic resonance (EPR) apparatus, as well as to a probehead itself and to a method of using the probehead.

BACKGROUND OF THE INVENTION

Electron paramagnetic resonance (EPR) spectroscopy is also known as electron spin resonance (ESR) spectroscopy; the terms will be considered as synonymous herein, and will be referred to simply as 'EPR' for conciseness. EPR is a powerful tool used in numerous branches of science.

However, in practice, the EPR signal can be relatively small and be subject to noise, such as thermal noise, so that the signal-to-noise ratio (SNR) is low. This means that there is a problem detecting the EPR signal, or there is a problem that long integration times are required to obtain useable data.

The apparatus used to deliver microwave power to a sample being studied by EPR is known as a probehead. The probehead is subjected to an applied magnetic field as part of the EPR, so there is also a problem that any modifications made to the probehead must not be negatively affected by a magnetic field. Furthermore, the probehead is typically inserted into a cryostat to control the temperature of the sample, so there are the problems that the space available on the probehead is limited, and the probehead must potentially operate at cryogenic temperatures.

The present invention aims to alleviate, at least partially, some or any of the above problems.

SUMMARY OF THE INVENTION

A first aspect of the present invention provides an insert for an EPR probehead, the insert comprising:
  a directional coupler, wherein the directional coupler is configured to receive microwave power from a source at a first port and to transfer a portion of the received microwave power to a second port for transmission to a sample space, and wherein the directional coupler is configured to receive a microwave signal from the sample space at the second port and to pass the majority of the received microwave signal to a third port;
  an amplifier having an input and an output, wherein the input is arranged to receive the microwave signal from the third port of the directional coupler and to produce an amplified version of the received microwave signal at the output for transmission to a detector.

Another aspect of the present invention provides a probehead comprising:
  an insert according to the first aspect of the invention; and
  a microwave resonator joined by a microwave path to the second port of the directional coupler.

A further aspect of the present invention provides a method comprising:
  providing a probehead according to the preceding aspect of the invention;
  sending microwave power from a source to the first port of the coupler;
  coupling a portion of the microwave power to a second port for transmission to the resonator;
  receiving a microwave signal from the resonator at the second port of the coupler;
  transmitting the majority of the received microwave signal to a third port of the coupler;
  receiving the microwave signal from the third port of the coupler at the amplifier comprised in the insert of the probehead;
  amplifying the microwave signal using the amplifier; and
  outputting an amplified version of the received microwave signal.

Further optional aspects of the invention are defined in the following description.

DESCRIPTION OF THE DRAWINGS

Embodiments of the invention will now be described, by way of non-limiting example, with reference to accompanying drawings, in which.

DETAILED DESCRIPTION OF THE INVENTION

A conventional EPR apparatus typically comprises a microwave bridge that contains a microwave source and a microwave detector. Microwave power is conveyed via one or more waveguides between the bridge (source and detector) and a probehead. In some cases a single waveguide is used both for the microwave power from the bridge (source) to the probehead and for the reflected microwave power returning to the bridge (detector), in which case a circulator in the bridge directs the returning microwaves to the detector and not to the source. Additionally, the bridge can have separate output and input ports for microwave waveguides (such as for transmission measurements).

The probehead comprises a microwave resonator (resonant cavity), for example of metal or dielectric, that includes a sample space and access thereto. A separate electromagnet applies a magnetic field across the sample space. Depending on the measurement, the magnetic field can be constant, swept or modulated as required. The bridge is coupled to electronics to drive the microwave source and magnet; to collect data from the detector; and to process the data e.g. to perform spectroscopy.

Figure 1:
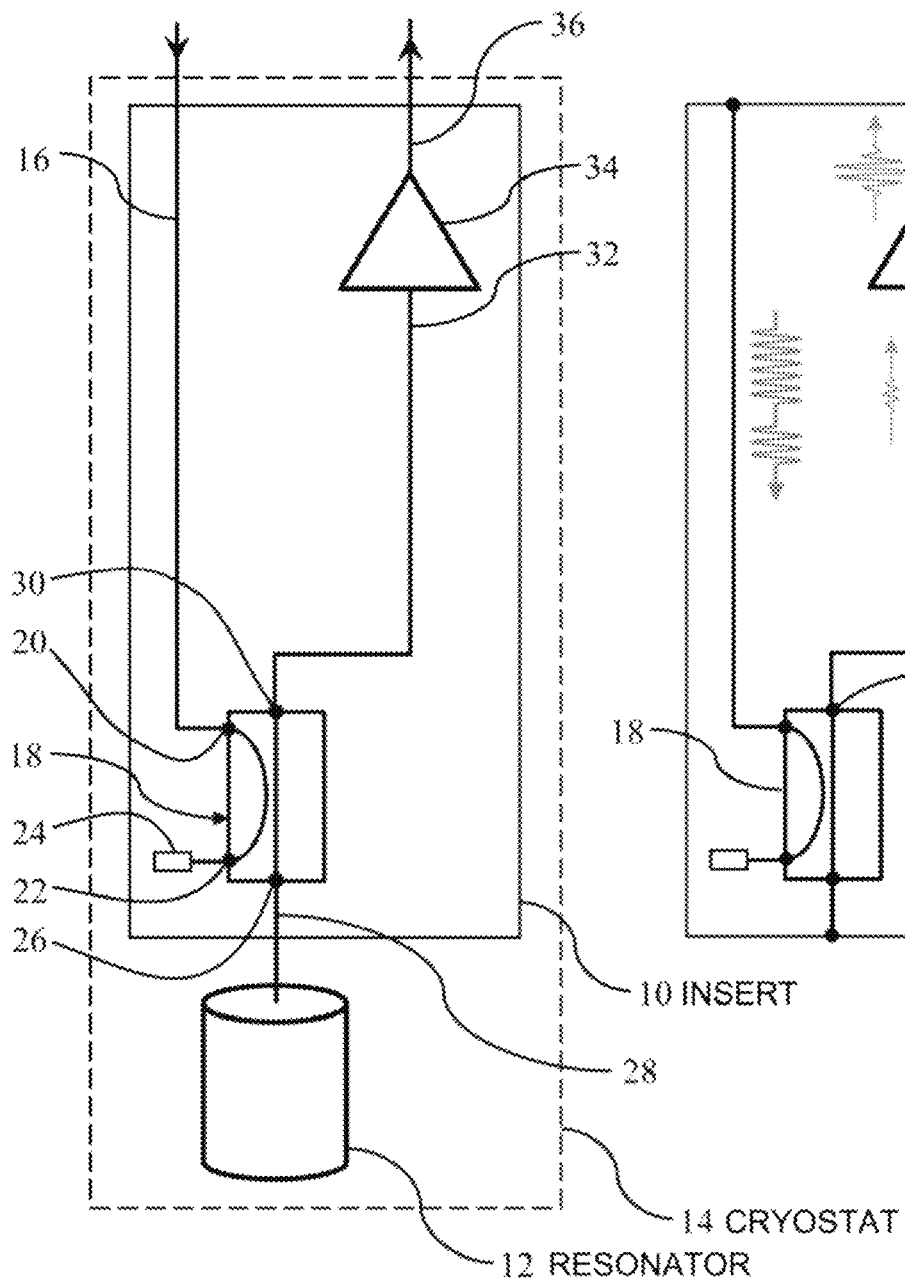
FIG. 1 is a schematic diagram of an EPR probehead including an insert according to an embodiment of the invention.

FIG. 1 illustrates schematically an EPR probehead comprising an insert 10 according to a first embodiment of the invention, and a resonator 12. The insert 10 is located (or inserted) in the microwave path(s) between the resonator 12 and the bridge (not shown). In the preferred embodiment, the probehead is removably insertable into a cryostat 14 to enable the temperature of the resonator 12 (with sample space and any sample therein) to be controlled, and optionally cooled to cryogenic temperatures e.g. below 150 K, for example using liquid nitrogen and/or liquid helium. The microwave bridge (not shown) and other electronics can be at room temperature outside the cryostat 14. The probehead can also be operated at room temperature, either inside or outside a cryostat, and a cryostat is an optional feature.

The insert 10 has semi-rigid input line 16 to convey microwave power from the bridge (not shown) to a directional coupler 18. The input line 16 delivers the microwave power to a first port 20 of the coupler 18. Most of the input microwave power is transferred to a 'transmitted port' 22 of the coupler 18. The transmitted port 22 is terminated, for example with a 50Ω load 24. The remaining portion of the microwave power is coupled to a second port 26 (also known as a coupled port), from which it is conveyed via a microwave path 28 (such as a waveguide) to the resonator 12. The proportion of power that is coupled to the second port 26 is given by the coupling factor C, which is defined as:

$$C = -10 \log(P_C/P_I) \text{ dB}$$

where $P_I$ is the power at the first port 20 (input port) and $P_C$ is the power at the second port 26 (coupled port). The convention of a minus sign in the definition of the coupling factor is used herein, such that, for example, a directional coupler with C=6 dB (referred to as a "6 dB coupler") means that approximately 25% of the power is transferred to the coupled port [in a convention without the minus sign in the definition, this would be called a "−6 dB coupler"].

Following interaction of the incident microwave power with a sample in the sample space (not shown) associated with the resonator 12, an EPR microwave signal (such as a spin echo) is returned via the microwave path 28 to the second port 26 of the coupler 18. Because the coupler 18 is a directional coupler, the second port 26 now acts as the input port, and most of the microwave signal is directed (transmitted) to a third port 30 of the coupler 18 (reduced by a portion of microwave power that is coupled back to the first port 20, as determined by the coupling factor C). The microwave signal from the third port 30 is conveyed to an input 32 of an amplifier 34 in the probehead. The amplifier 34 generates an amplified version of the microwave signal which is output on an output 36 and is conveyed from the insert 10, away from the probehead, out of the cryostat 14, and to the microwave bridge (not shown). Preferably the amplified microwave signal is conveyed directly to an input port of the bridge or directly to the microwave detector, by-passing any circulator in the bridge.

The function of the directional coupler 18 is to suppress thermal noise coming down the input line 16, from the room temperature environment outside the cryostat 14, because most of the noise power is directed to the termination load 24 and so does not reach the resonator 12. Hence the SNR is improved. The cost of this is that the maximum power (and hence bandwidth) of applied microwave pulses reaching the resonator 12 is also reduced, but the improvement in SNR more than compensates for this as shown later in the results section. One can also use higher power microwave amplification to compensate for the power loss. An embodiment of the invention could use a 3 dB coupler (50:50), but the preferred range of coupling factor C is from 6 dB to 30 dB. If C is smaller than 6 dB then the noise reduction benefit is relatively small, and of course a significant portion of the echo signal returning from the resonator is coupled back to the input line 16 so does not reach the amplifier 34 so useful signal power is lost. If C is greater than 30 dB, then the applied microwave excitation power reaching the resonator 12 starts to become too small. A preferred range of coupling factor C of the coupler 18 is from 6 dB to 15 dB. Exemplary couplers include the Pasternack PE2CP series (Pasternack, Irvine, CA, USA).

The amplifier 34 amplifies the microwave signal before it leaves the insert 10, and it is supplied with electrical power via wires (not shown) from a power supply in the external environment. In some contexts the amplifier may be referred to as a 'preamplifier' because further amplification is usually provided in the bridge or spectrometer, so the terms 'amplifier' and 'preamplifier' used herein should be seen as synonymous. The amplifier preferably has a very low noise temperature, will handle the required microwave power without saturating, and operates over a desired signal frequency range, such as from 1 or 2 GHz ideally up to 300 GHz, incorporating the widely used X band of microwaves at around 10 GHz. The amplifier can be selected to operate over a desired frequency range of interest within the overall microwave band, and different amplifiers can be used for inserts intended for different frequency ranges. Suitable amplifiers can comprise a field-effect transistor (FET). A particularly suitable FET is the high electron mobility transistor (HEMT), comprising a semiconductor heterostructure. The high mobility of the electrons in the structure means that the device has low noise. An exemplary amplifier for use in an embodiment of the invention is the Low Noise Factory LNF-LNC6_20C cryogenic HEMT preamplifier (34 dB gain; noise temperature of 2.5 K at 4 K, and 70 K at room temperature, Low Noise Factory AB, Göteborg, Sweden). In a preferred arrangement, the amplifier 34 is thermalized via a copper arm extending below the resonator 12.

There are a number of advantages in having the amplifier 34 as part of an insert 10 for a probehead. When the sample at the resonator is cooled, then the amplifier is also cooled, which lowers the noise temperature of the amplifier (and which wouldn't occur if the amplifier where located for example in the bridge). As already explained, the directional coupler isolates the detection circuit from room temperature noise, but if the amplifier were located in the bridge, then one would add in room temperature noise even if the sample were cold. Placing the amplifier 34 in close proximity to the resonator 12 also avoids signal losses and the introduction of noise along the microwave path before amplification of the signal. For this reason, a SNR improvement in collected EPR data is even achieved when the probehead and sample are at room temperature (see results). In a preferred embodiment of the invention, the microwave path between the resonator 12 and the amplifier 34 is less than 100 mm, and can be less than 50 mm, such as down to around 20 mm.

A second embodiment of an EPR probehead insert 10 will now be described with reference to FIG. 2; like parts will be indicated with like reference numerals as used in FIG. 1, and a detailed description of the parts in common that have already been described in the embodiment of FIG. 1 will be omitted. All of the features of the first embodiment can be imported into this second embodiment, individually or in any combination.

In some circumstances it can be desirable to restrict the microwave power reaching the input 32 of the amplifier 34 to avoid damage to the subsequent microwave components and damage to the amplifier itself (which is typically the most expensive component of the insert). This is particularly true for measurements using pulsed microwave excitations, which can be very high power, for example 1 kW at X band.

A portion of the excitation pulse power may be reflected from the resonator and directed to the amplifier, followed by the spin echo signal, which can be lower power.

A first feature to restrict the power reaching the amplifier is a power limiter 40 between the third port 30 of the coupler 18 and the amplifier 34. The limiter 40 can be a single device or can be two or more devices in series. An exemplary limiter 40 has a 500 W peak power, 130 mW flat leakage, recovery time <200 ns, and 0.1% duty cycle, for example a Narda LIM-301 limiter (Narda-MITEQ, Hauppauge, NY, USA).

A second feature to restrict the power reaching the amplifier 34 is a switch 42 to divert microwave power away from the amplifier input 32 during the high power microwave excitation pulse, and to switch the spin echo (EPR) microwave signal to the amplifier input 32 at other times. FIG. 2 shows diagrammatically: an input pulse on the input line 16 on the left-hand side; the reflected pulse diverted by the switch 42 in one state to a termination 44, such as a 50Ω load; the spin echo microwave signal directed by the switch 42 in another state to the amplifier input 32; and the amplified spin echo microwave signal at the amplifier output 36. In a preferred embodiment of the invention, the switch 42 is a solid-state, fast, non-reflective switch, for example Analog Devices HMC547ALP3E (<20 ns switching time; 40 dB isolation, Analog Devices, Inc., Wilmington, MA, USA). The operation of the switch 42 can be controlled by a signal from the electronics associated with the EPR spectrometer and bridge (which also controls the microwave source pulses).

Figure 2:
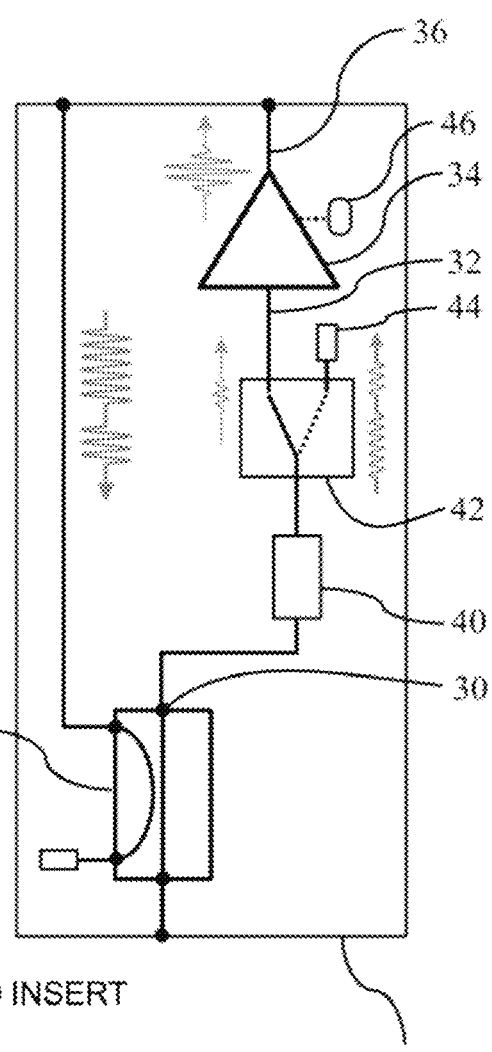
FIG. 2 is a schematic diagram of an insert for an EPR probehead according to another embodiment of the invention.

Although FIG. 2 shows the preferred embodiment, depending on requirements, the limiter 40 could be omitted, or the switch 42 could be omitted, or the sequence of the limiter 40 followed by the switch 42 could be swapped. For continuous wave (CW) operation and for sufficiently low pulse power operation, both the limiter 40 and switch 42 could be omitted, as in the embodiment of FIG. 1.

FIG. 2 shows a further optional feature of the insert 10, namely a temperature sensor 46 (such as a resistance thermometer) in thermal contact with the amplifier 34 for measuring the temperature of the amplifier. The temperature of a sample can be inferred from a sensor built into the cryostat. Optimal measurements are obtained when the sample temperature and the amplifier temperature are equalized, to ensure proper thermalization of the microwave components of the insert 10. The temperature sensor 46 can be used in the first embodiment of the invention of FIG. 1 i.e. without the limiter 40 and switch 42.

The insert 10 of any of the above embodiments can be provided as an integrated, compact, three-port package for use with any suitable probehead. Typical insert dimensions are approximately 40 mm×20 mm×8 mm.

Results

X-band EPR measurements were performed using a modified Bruker ER 4118SPT probehead (Bruker Corporation, Billerica, MA, USA) equipped with a Bruker X-band ER 4118X MD5W microwave resonator and using a probehead insert according to the preferred embodiment of FIG. 2 using the exemplary microwave components as described above for the insert. The probehead was connected to a Bruker ELEXSYS E580 EPR spectrometer, equipped with a 1 kW traveling-wave tube (TWT) amplified microwave source.

Figure 3:
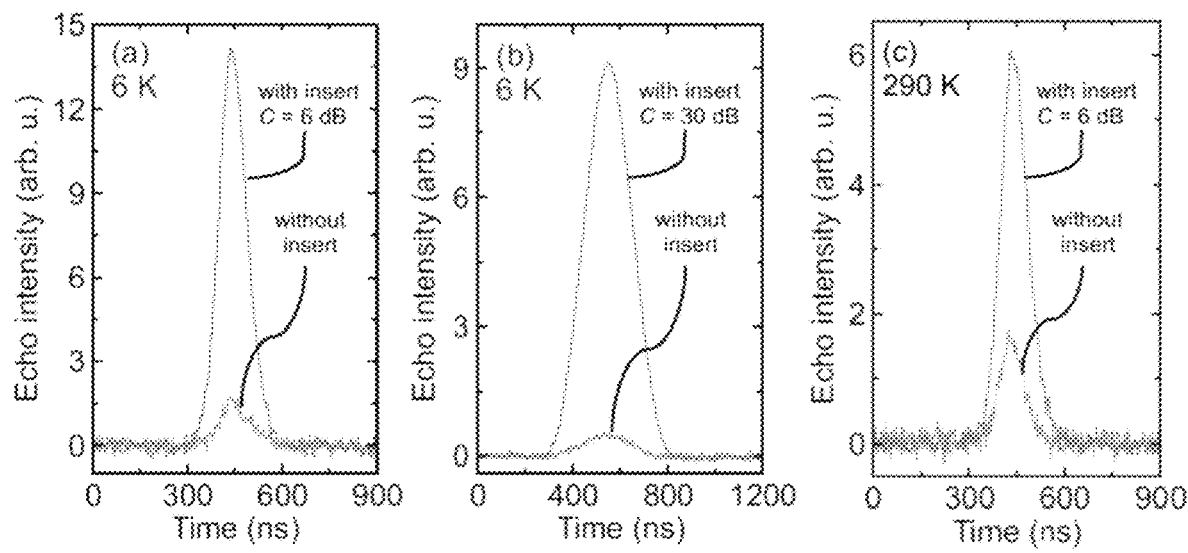
FIGS. 3a-3c show plots of EPR Hahn echoes obtained using different embodiments of the invention under different conditions in comparison with using conventional EPR apparatus.

FIG. 3 shows the results of measurements of the Hahn echo of a standard coal sample, in a 4 mm outer diameter EPR tube, using pulsed EPR, comparing the signal obtained using an insert according to an embodiment of the invention, and using a conventional setup without the insert (in the conventional setup, the input line is directly connected to the resonator, bypassing the coupler, but the position of the resonator and sample were kept fixed, and all other experimental parameters were kept essentially constant, except the microwave power was adjusted to yield the same duration of the π pulse with and without the insert). The Hahn echo traces have been shifted to remove any background offset, and the amplitudes have been normalized with respect to the noise level calculated for each trace (i.e. the traces have been scaled such that the noise level is the same with and without the insert).

As can be seen, the sensitivity of the measurement is improved in FIG. 3a using a 6 dB coupler at 6 K, with a voltage SNR increase by a factor of approximately 9.6. This represents a potential reduction in measurement time by a factor of 90. Using a 30 dB coupler also at 6 K in FIG. 3b shows an increase in SNR by a factor of approximately 18.8, representing a remarkable 350-fold decrease in measurement time. This means that experiments that would normally take a full day could be performed in less than 5 minutes. The gain in sensitivity can also be used to reduce the spin concentration or sample volume, enabling studies on systems that are conventionally not possible, or not possible at X-band. FIG. 3c shows the corresponding results at 290 K with a 6 dB coupler, giving a significant improvement even at room temperature, with the SNR increased by roughly 3.2, so a 10-fold reduction in measurement time.

Figure 4:
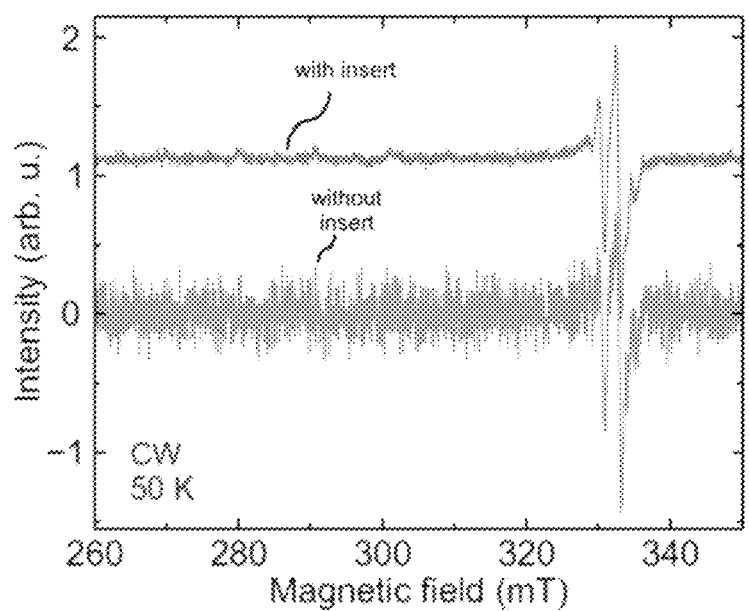
FIG. 4 shows a comparison of continuous-wave (CW) EPR spectra obtained using an embodiment of the invention and using conventional apparatus.

FIG. 4 shows the improvement obtained using an insert embodying the invention with CW EPR. The measurements were performed at 50 K using a powder sample of $[(CH_3)_2 NH_2][Zn(HCOO)_3]$ metal-organic framework, where 1 mol % of Zn(II) was replaced by Cu(II). The spectra are normalized to the Cu(II) signal, and in the figure the graphs are vertically offset for clarity. Using an insert with a 6 dB coupler, the SNR is enhanced by a factor of about 4.9.

Figure 5:
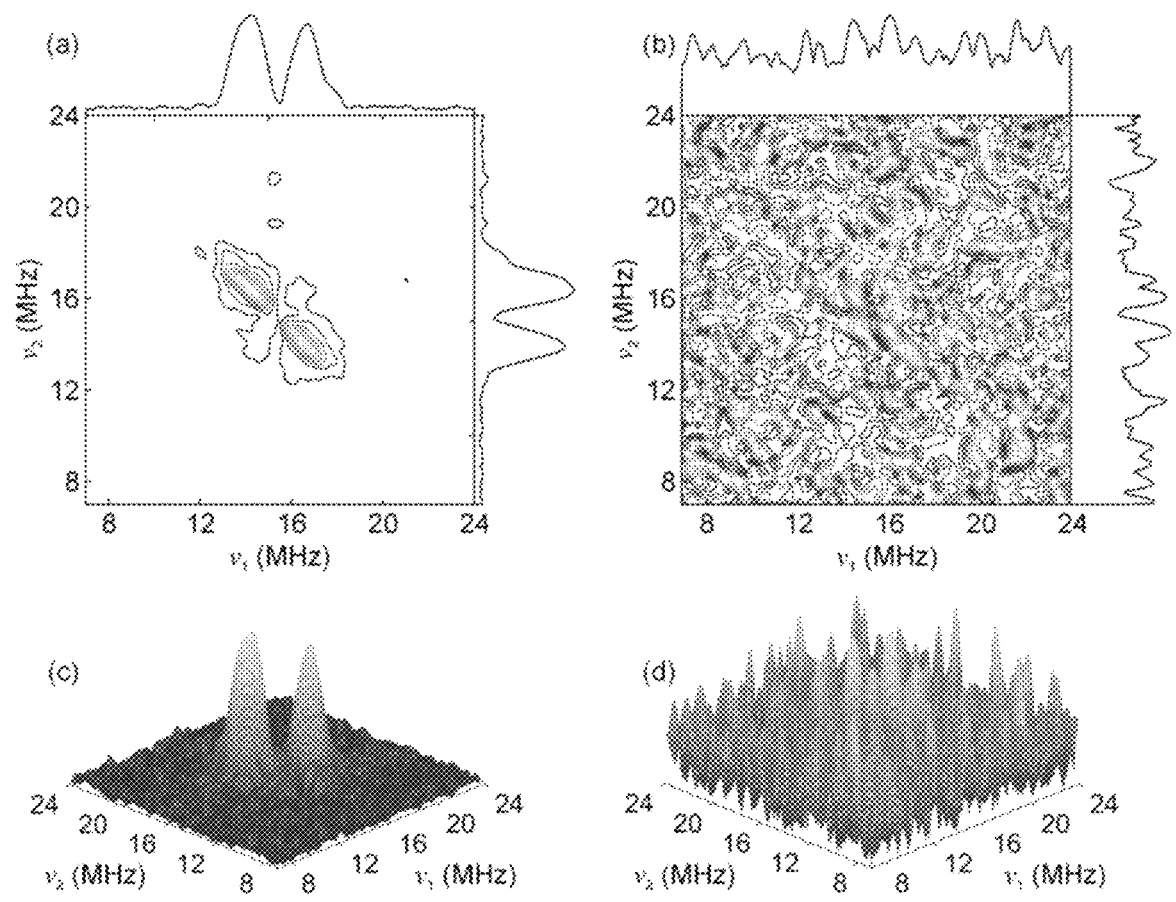
FIGS. 5a-5d show a comparison of EPR hyperfine sublevel correlation spectroscopy (HYSCORE) results obtained using an embodiment of the invention and using conventional apparatus.

FIG. 5 shows the results of HYSCORE experiments at 10 K and 357.7 mT on a respiratory complex I sample. The $^1H$ HYSCORE spectra (contour plots with skyline projections) obtained in 1 hour of signal averaging with and without the insert are presented in FIGS. 5a and 5b respectively. The spectrum obtained with the insert shows strong 1H ridges peaked at (14.1, 16.4) and (16.4, 14.1) MHz (FIG. 5a). The SNR is much worse using the standard setup (FIG. 5b). The increase in the SNR is better revealed in the corresponding 3D plots presented in FIGS. 5c and 5d (with and without the insert, respectively). The SNR is improved by a factor of approximately 9 with the insert.

Figure 6:
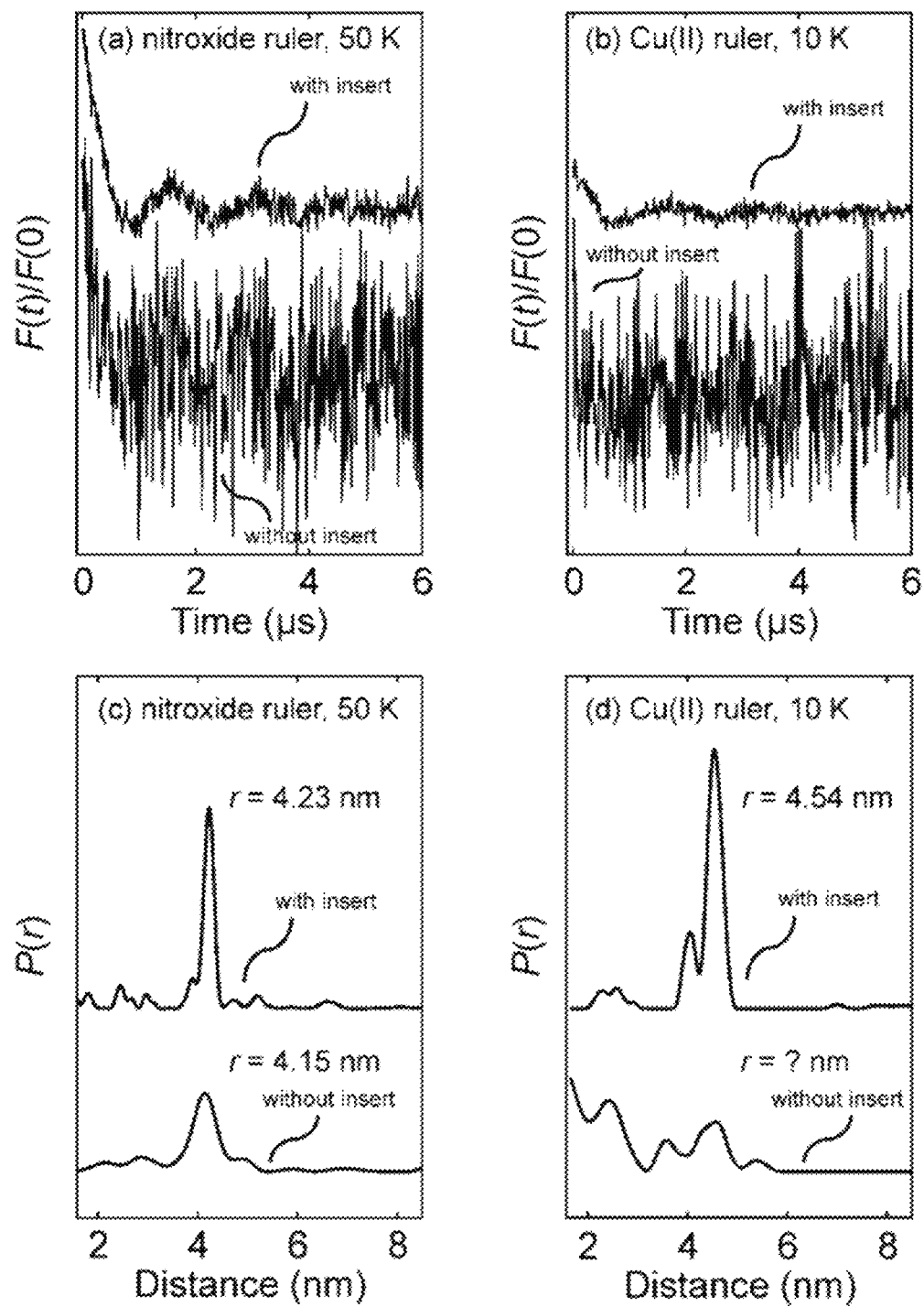
FIGS. 6a-6d show a comparison of EPR double electron-electron resonance (DEER) results obtained using an embodiment of the invention and using conventional apparatus.

Nitroxide and Cu(II) molecular rulers, with lengths of approximately 4.2 nm and 4.5 nm, respectively, were used to assess the SNR improvement for DEER experiments comprising dipole spectroscopy at X-band. The experiments were performed at 50 K for nitroxide and 10 K for Cu(II). The primary DEER data was background-corrected to yield the form factor plots of FIGS. 6a and 6b. The corresponding distance distributions obtained by Tikhonov regularization are shown in FIGS. 6c and 6d. The indicated distances correspond to the maxima of the distributions. The nitroxide results are in FIGS. 6a and 6c, and the Cu(II) results are in FIGS. 6b and 6d. In all cases, the graphs obtained with an insert embodying the invention (with 6 dB coupler), and without an insert, have been displaced vertically from each other for clarity to avoid overlap, with the upper graphs in each figure being those obtained with the probehead insert.

For the nitroxide measurements at 50 K, the SNR was improved by a factor of 6.7 with the insert. For the Cu(II) measurements at 10 K, the SNR was improved by a factor of about 10 with the insert. In the case of Cu(II)-Cu(II) distance measurements using the Cu(II) ruler, the DEER data acquired with the conventional setup have very poor SNR leading to unstable analysis by Tikhonov regularization and unreliable distance distribution (FIG. 6d). In contrast, the DEER trace acquired in the same amount of time with the probehead insert embodying the invention provides a well-resolved peak at the expected Cu(II)-Cu(II) distance.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. An insert for an EPR probehead, the insert comprising:
   a directional coupler, wherein the directional coupler is configured to receive microwave power from a source at a first port and to transfer a portion of the received microwave power to a second port for transmission to a sample space, and wherein the directional coupler is configured to receive a first microwave signal from the sample space at the second port and to pass a majority of the received first microwave signal to a third port as a second microwave signal;
   an amplifier having an input and an output, wherein the input is arranged to receive the second microwave signal from the third port of the directional coupler and to produce an amplified version of the received second microwave signal at the output for transmission to a detector; and
   wherein the amplifier comprises a high electron mobility transistor.

2. The insert according to claim 1 further comprising a microwave power limiter connected in a microwave path between the third port of the directional coupler and the input of the amplifier.

3. The insert according to claim 1 further comprising a switch in a microwave path between the third port of the directional coupler and the input of the amplifier, the switch being configured to selectively switch between diverting microwave power away from the amplifier input and directing microwave power towards the amplifier input.

4. The insert according to claim 1 wherein a coupling factor of the directional coupler is in a range from 6 dB to 30 dB.

5. The insert according to claim 1 further comprising a temperature sensor configured to sense a temperature of the amplifier.

6. A probehead comprising:
   an insert according to claim 1; and
   a microwave resonator joined by a microwave path to the second port of the directional coupler.

7. The probehead according to claim 6 wherein the amplifier is positioned in proximity to the microwave resonator.

8. The probehead according to claim 6 wherein the microwave path joining the microwave resonator and the amplifier is less than 100 mm.

9. The probehead according to claim 6 adapted to operate within a cryostat.

10. A method for operating a probehead, the method comprising the steps of:
    providing the probehead according to claim 6;
    sending microwave power from a source to the first port of the directional coupler;
    coupling a portion of the microwave power to a second port of the directional coupler and transmitting the portion of the microwave power to the resonator;
    receiving a first microwave signal from the resonator at the second port of the directional coupler;
    transmitting a majority of the received first microwave signal to a third port of the coupler as a second microwave signal;
    receiving the second microwave signal from the third port of the coupler at the amplifier in the insert of the probehead;
    amplifying the second microwave signal using the amplifier; and
    outputting an amplified version of the received microwave signal.

11. The method according to claim 10 further comprising:
    providing a switch in a microwave path between the third port of the directional coupler and the input of the amplifier, the switch being configured to selectively switch between diverting microwave power away from the amplifier input and directing microwave power towards the amplifier input;
    sending a microwave pulse to the microwave resonator;
    operating the switch to divert a microwave power of the microwave pulse that is reflected from the microwave resonator away from the amplifier input; and
    operating the switch to direct a microwave power of an EPR signal from a sample at a sample space associated with the microwave resonator towards the amplifier input.

* * * * *